United States Patent
DuBose

(10) Patent No.: US 7,830,643 B2
(45) Date of Patent: Nov. 9, 2010

(54) POWER SUPPLY WITH ELECTROSTATIC COOLING FAN

(75) Inventor: Richard G. DuBose, Scottsdale, AZ (US)

(73) Assignee: iGo, Inc., Scottsdale, AZ (US)

( * ) Notice: Subject to any disclaimer, the term of this patent is extended or adjusted under 35 U.S.C. 154(b) by 217 days.

(21) Appl. No.: 11/337,400

(22) Filed: Jan. 23, 2006

(65) Prior Publication Data

US 2007/0171593 A1 Jul. 26, 2007

(51) Int. Cl.
*G03G 15/02* (2006.01)

(52) U.S. Cl. .................. 361/225; 422/186.15

(58) Field of Classification Search .............. 361/225, 361/230
See application file for complete search history.

(56) References Cited

U.S. PATENT DOCUMENTS

| | | | | |
|---|---|---|---|---|
| 4,049,400 | A * | 9/1977 | Bennett et al. | 96/80 |
| 4,231,766 | A * | 11/1980 | Spurgin | 96/79 |
| 5,484,472 | A * | 1/1996 | Weinberg | 96/26 |
| 5,734,555 | A * | 3/1998 | McMahon | 361/704 |
| 6,522,536 | B2 * | 2/2003 | Brewer et al. | 361/679.47 |
| 2004/0047775 | A1 * | 3/2004 | Lau et al. | 422/186.04 |
| 2005/0000949 | A1 * | 1/2005 | Watanabe et al. | 219/121.52 |
| 2005/0053530 | A1 * | 3/2005 | Wu | 422/186.15 |
| 2005/0077103 | A1 | 4/2005 | Ikeda et al. | |
| 2006/0002051 | A1 * | 1/2006 | Goudy, Jr. | 361/220 |
| 2006/0061967 | A1 * | 3/2006 | Kim et al. | 361/704 |
| 2006/0169441 | A1 | 8/2006 | Schlitz | |

FOREIGN PATENT DOCUMENTS

| | | |
|---|---|---|
| DE | 10 2005 003 478 A1 | 5/2006 |
| EP | 1 571 489 A1 | 9/2005 |
| JP | 09 252068 | 9/1997 |
| WO | WO 94/12282 | 6/1994 |

OTHER PUBLICATIONS

PCT Search&Written Report, Jun. 9, 2007, PCT.
F. Yang, et al, "Corona driven air propulsion for cooling of electronics" XIIth International Symposium on High Voltage Engineering, Netherlands, 2003.

* cited by examiner

*Primary Examiner*—Stephen W Jackson
*Assistant Examiner*—Tien Mai
(74) *Attorney, Agent, or Firm*—Snell & Wilmer, L.L.P.

(57) ABSTRACT

A power supply having an electrostatic circuit producing sufficient ionic motion to move ambient air over heated surfaces. The electrostatic circuit creates a corona discharge from several emitter point sources producing sufficient ionic motion to move ambient air over a hot surface, such as a heatsink or heatfins, which surface is in communication with the power supply housing. A high DC voltage is generated within the power supply when the power supply is energized to create the ionic motion.

20 Claims, 2 Drawing Sheets

SECTION 2-2

POWER SUPPLY WITH ELECTROSTATIC COOLING FAN

FIELD OF THE INVENTION

The present invention is generally related to power supplies, including power converters such as those adapted to power portable electronic devices, and more particularly to such devices having integral cooling mechanisms.

BACKGROUND OF THE INVENTION

Power supplies, including power converters adapted to power and/or charge portable electronic devices, often generate excessive heat due to the conversion of power from one form to another. Conventional cooling devices include heatsinks, mechanical cooling fans, heatfins and so forth that are adapted to communicate internal heat to the ambient to keep the device operating within suitable temperature ranges conforming with safety guidelines.

Power converters, such as those adapted to receive a power source having an AC or DC voltage and suitable current, include those that are adapted to power and/charge portable electronic devices including portable computers, MP3 players, digital cameras, cell phones, gaming devices, just to name a few. These converters are extremely compact, and provide a significant amount of power per cubic unit volume of the converter. Conventional power converters providing 75 watts and higher generate significant heat and require cooling to prevent thermal shut down of the device during operation. Conventionally, heatsinks and cooling fins are typically utilized to distribute internally generated heat to the ambient. Some devices include micro fans for increasing ambient air flow across heatsinks. Such mechanical fans are suitable for cooling the power converters, yet add another layer of cost and complexity to the device as they are not solid state mechanisms and are prone to failure.

There is desired an improved power supply having solid state cooling in a compact design, and at a affordable price.

SUMMARY OF INVENTION

The present invention achieves technical advantages as a power supply having an electrostatic cooling mechanism producing sufficient ionic motion to move ambient air over heated surfaces.

In one preferred embodiment of the invention, the electrostatic cooling mechanism uses a corona discharge generated from several point sources to produce sufficient ionic motion to move ambient air over a hot metal plate, such as a heatsink or heatfins, that form a portion of the power supply. A high DC voltage is generated within the power supply when the power supply is energized and this high voltage is used to generate the corona discharge

DETAILED DESCRIPTION OF THE PRESENT INVENTION

Figure 1:
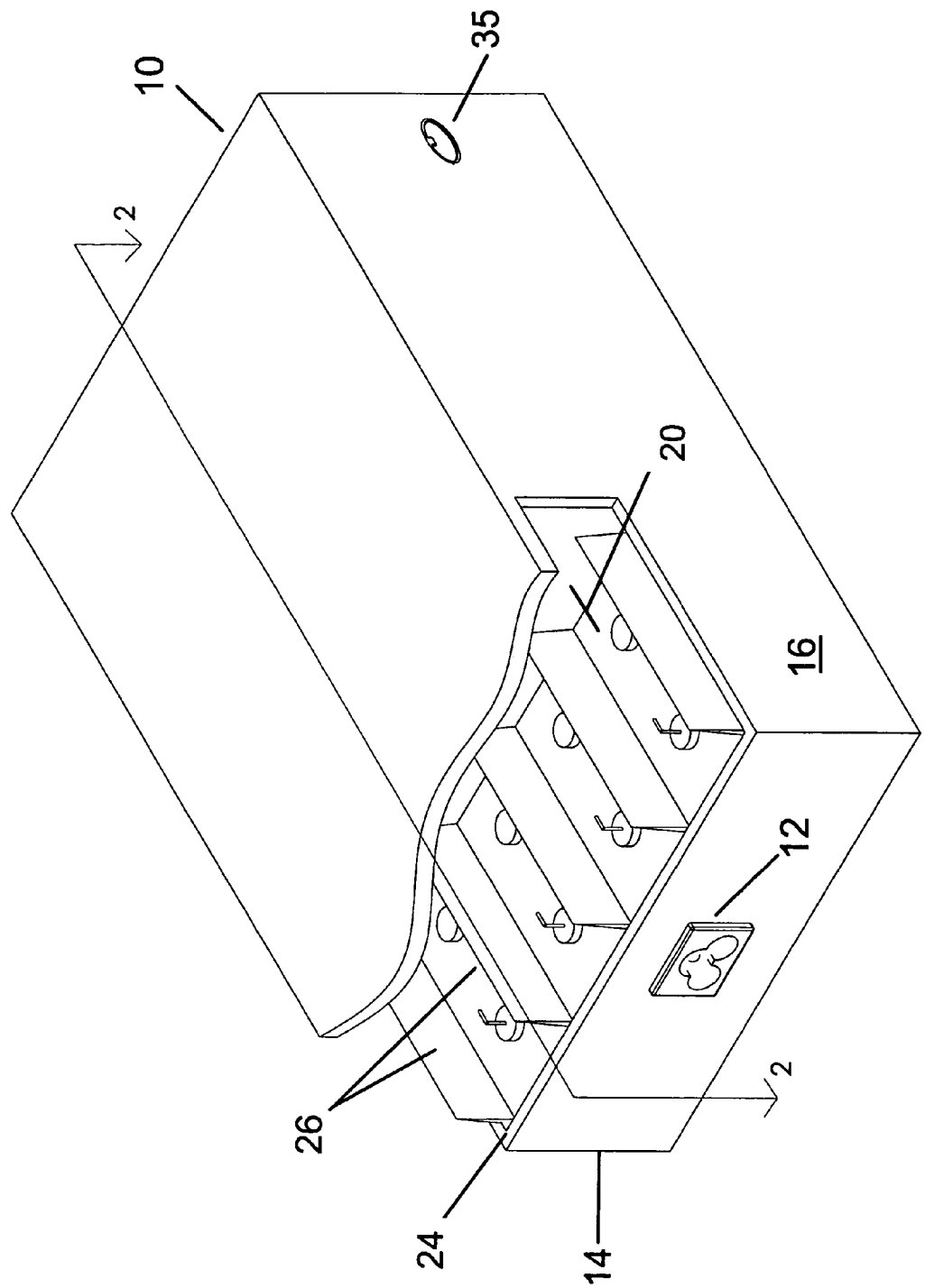
FIG. 1 is a side elevational view of a power converter with a solid state cooling device of the present invention.

Referring now to FIG. 1, there is shown a perspective end view of a power supply according to one embodiment of the invention, depicted as a power converter at 10. Converter 10 is seen to have a connector 12 adapted to receive a power source, which power source may provide a DC or AC voltage, such as from an automobile or airplane in the case of a DC voltage, or from line power in the case of an AC voltage, although limitation to these types of sources is not to be inferred in the present invention. Converter 10 is further seen to include a housing 14 encompassing power supply circuitry 16, which circuitry generates significant heat within a cavity 18 of housing 14 during operation.

Still referring to FIG. 1, there is shown a plurality of parallel elongated fluid channels extending thru an upper portion of converter 10 proximate an upper surface 22 of a planar member 24 defining an upper portion of cavity 18. Member 24 may be comprised of a thermally conductive material, such as a metal, plastic or other material, and may further include upwardly extending heatfins 26 defining longitudinally extending channels 20.

Figure 2:
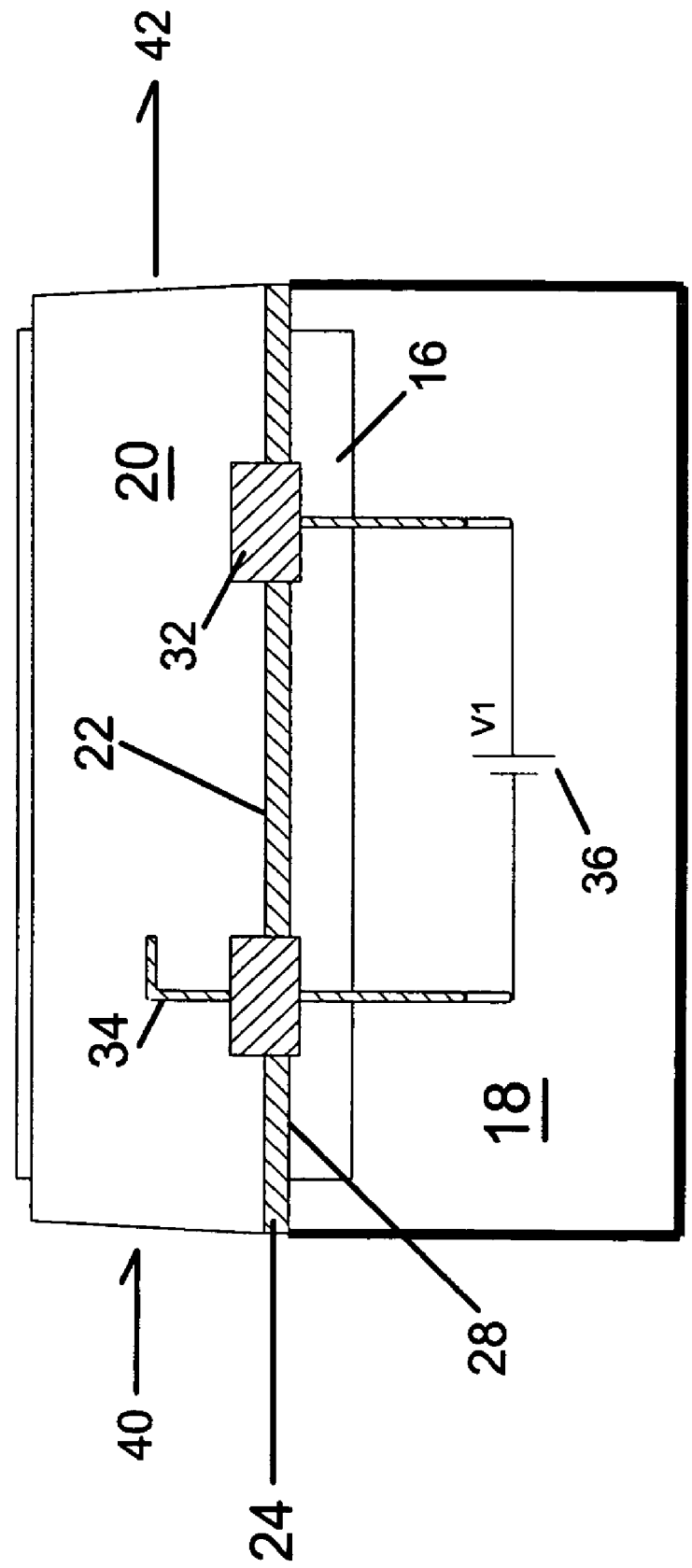
FIG. 2 is a cross sectional view taken along line 2-2 in FIG. 1.

Referring to FIG. 2, there is shown a cross sectional view taken along 2-2 in FIG. 1 depicting the internal housing cavity 18 including the power supply circuitry 16 generating heat during operation, as well as one cooling channel 20. Further shown in FIG. 2 is fluid channel 20 laterally extending above and interfaced with this member 22 seen to have some circuitry 16 thermally and physically secured to a lower surface 28 thereof, and a plurality of emitters comprising anodes 32 and cathodes 34 each extending upwardly from the upper surface 22 thereof into respective channel 20. The circuitry 16 disposed within cavity 18 receives power from the power source (not shown) via connector 12, and provides output power via an output connector 35 adapted to provide power to a portable electronic device to be powered, including portable electronic devices as previously discussed.

Advantageously, circuitry in cavity 18 further includes circuitry 36 adapted to generate a high DC voltage VI between anodes 32 and cathodes 34 when the power supply circuitry 16 is energized by the source power. By providing this high DC voltage VI across the emitter tips of anodes 32 and cathodes 34, sufficient ionic motion is generated to move ambient air in channels 20 over the upper cooling surface 22 of member 24 to enhance cooling the device 10. Significant heat generator within cavity 18 is communicated by convection and conduction to member 24, and heat is removed therefrom by inducing ambient air flow across upper surface 22 due to the ionic motion generation by the energized pin point emitters. A high DC voltage VI' such as 5-11 kilovolts, is generated by the circuitry 36 to generate sufficient ionization of the ambient air within channels 20 to create ambient air flow. As shown, the ground potential of this high DC voltage VI is connected to each cathode 34 at one end of the respective fluid channel 20, and the positive potential is provided to each anode 32 at a opposing end of the air channel 20, as shown. As shown in FIG. 2, ambient air is induced to flow into the inlet 40 proximate the cathode 34, which air is induced to flow towards the anode 32 and exit the outlet 42.

The rate of airflow in channels 20 is a function of the voltage potential $V_1$ generated between the respective anode 32 and the cathode 34, as well as the distance therebetween. Other parameters effecting the rate of airflow include the dielectric constant of the air to be communicated through the channel 20, as well as the dimensions of the fluid channel 20, the temperature of the air and the altitude (barometric pressure).

By way of example, for a particular anode and cathode spaced 5 cm distance, provided with a voltage potential $V_1$ of 8 KV, an airflow rate of 174 LFM (linear feet per minute) may be achieved In one preferred embodiment, the emitter tips of the emitters 34 are coated with thorium oxide (or some other appropriate material that enhances ionization) to enhance ionization in the presence of the high voltage potential $V_1$. Ions generated travel from the emitter pin points 34 and down the air channel 20 toward anode 32 to induce airflow. The ozone is an ionization by product.

Advantages of the present invention include a highly compact power supply with no moving parts. Creating ambient airflow through the cooling channels proximate the surface to be cooled is achieved with no moving parts, which significantly increases the mean time between failure (MTBF) as no moving parts are required such as from a mechanical micro fan. The high voltage $V_1$ is readily obtained using low cost power supply circuitry disposed with the cavity of the power supply. Moreover, the extrusion of heat from within the cavity 18 does not require providing an opening to internal portions of the power supply, i.e. cavity 18, so safety testing is not effected. This induced ionic airflow is also silent and unnoticeable by the user, as there are no moving fan blades. Power supply MTBF is effected by the high voltage components, and not by the life of a mechanical fan.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

What is claimed is:

1. A power converter, comprising:
    a first circuit having an input adapted to receive an input power and convert the input power to an output power provided to an output;
    a housing encompassing the first circuit and having a thermally conductive member disposed proximate a portion of the first circuit, such that the first circuit is located in a first cavity defined by the thermally conductive member; and
    a second circuit configured to receive the input power and comprising a first emitter having a cathode and an anode, wherein the cathode and the anode are located in a second cavity which is opposite the first cavity, wherein the second circuit is adapted to create substantially directed ambient air flow across the thermally conductive member without using any moving parts, wherein the ambient air enhances cooling the power converter, wherein the substantially directed ambient air flow is substantially directed parallel to the thermally conductive member, and wherein the air flow is substantially contained within the second cavity.

2. The power converter as specified in claim 1 wherein the output power is adapted to power a separate portable electronic device.

3. The power converter as specified in claim 2 wherein the thermally conductive member is thermally coupled to at least one component of the first circuit.

4. The power converter as specified in claim 3 wherein the output power has a DC voltage.

5. The power converter as specified in claim 3 wherein the thermally conductive member is mechanically coupled to at least one component of the first circuit.

6. The power converter as specified in claim 1 wherein the second circuit provides ionic motion adapted to create the ambient air flow across the thermally conductive member.

7. The power converter as specified in claim 6 wherein the second circuit creates a corona discharge.

8. The power converter as specified in claim 7 wherein the second circuit includes a plurality of point emitters.

9. The power converter as specified in claim 8 wherein the plurality of point emitters are coated with thorium oxide.

10. The power converter as specified in claim 1 wherein the second circuit produces a voltage in excess of about 250 volts creating ambient air flow.

11. The power converter as specified in claim 7 wherein the corona discharge is configured to induce and enhance cooling.

12. The power converter as specified in claim 7 wherein the corona discharge is not adapted for providing air purification external the housing.

13. The power converter of claim 1, wherein the second circuit comprises:
    a second emitter comprising an anode and a cathode;
    wherein the first emitter and the second emitter facilitate the creation of the substantially directed ambient air flow.

14. The power converter of claim 13, wherein the first emitter is aligned substantially parallel to the second emitter.

15. The power converter of claim 8, wherein the plurality of point emitters are configured to create the ambient air flow in a substantially single direction.

16. The power converter of claim wherein the anode and the cathode are substantially planar to each other.

17. The power converter of claim 13 wherein the first emitter and the second emitter are positioned on the same surface.

18. A method of cooling a power converter, the method comprising:
    converting, in a first circuit, a received input power to generate an output power; and
    creating, in a second circuit, a substantially directed ambient air flow without using any moving parts, wherein the substantially directed ambient air flow enhances cooling the power converter and wherein the second circuit comprises a cathode and an anode;
    wherein the first circuit and the second circuit are enclosed within a housing wherein a thermally conductive member divides the housing creating a first cavity and a second cavity, and wherein the thermally conductive member is disposed proximate a portion of the first circuit such that the first circuit is located in the first cavity;
    wherein the cathode and the anode are located in the second cavity, and
    wherein the substantially directed ambient air flow is substantially directed parallel to the thermally conductive member within the second cavity.

19. The method of claim 18, wherein the creating the substantially directed ambient air flow further comprises creating a corona discharge using a first emitter and a second emitter.

20. The method of claim 19, wherein the first emitter is aligned substantially parallel to the second emitter.

* * * * *

UNITED STATES PATENT AND TRADEMARK OFFICE
CERTIFICATE OF CORRECTION

| | | |
|---|---|---|
| PATENT NO. | : 7,830,643 B2 | Page 1 of 1 |
| APPLICATION NO. | : 11/337400 | |
| DATED | : November 9, 2010 | |
| INVENTOR(S) | : Richard G. DuBose | |

It is certified that error appears in the above-identified patent and that said Letters Patent is hereby corrected as shown below:

In column 4, line 30, claim 16 should be as follows:

16. The power converter of claim 1 wherein the anode and the cathode are substantially planar to each other.

In column 4, line 45, claim 18 should be as follows:

18. A method of cooling a power converter, the method comprising:
converting, in a first circuit, a received input power to generate an output power; and
creating, in a second circuit, a substantially directed ambient air flow without using any moving parts, wherein the substantially directed ambient air flow enhances cooling the power converter, and wherein the second circuit comprises a cathode and an anode;
wherein the first circuit and the second circuit are enclosed within a housing, wherein a thermally conductive member divides the housing creating a first cavity and a second cavity, and wherein the thermally conductive member is disposed proximate a portion of the first circuit such that the first circuit is located in the first cavity; wherein the cathode and the anode are located in the second cavity, and
wherein the substantially directed ambient airflow is substantially directed parallel to the thermally conductive member within the second cavity.

Signed and Sealed this
Twenty-fifth Day of January, 2011

David J. Kappos
*Director of the United States Patent and Trademark Office*